(12) United States Patent
Kim et al.

(10) Patent No.: US 10,275,094 B2
(45) Date of Patent: Apr. 30, 2019

(54) PHOTO SENSOR CIRCUIT, PHOTO SENSOR PIXEL, AND DISPLAY DEVICE HAVING THE PHOTO SENSOR PIXEL

(71) Applicant: Samsung Display Co., Ltd., Yongin-Si, Gyeonggi-Do (KR)

(72) Inventors: Keunwoo Kim, Seongnam-si (KR); Sooyoung Park, Seoul (KR); Joonghyun Park, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 21 days.

(21) Appl. No.: 15/715,590

(22) Filed: Sep. 26, 2017

(65) Prior Publication Data

US 2018/0203537 A1  Jul. 19, 2018

(30) Foreign Application Priority Data

Jan. 16, 2017  (KR) ......................... 10-2017-0007295

(51) Int. Cl.
*G06F 3/042* (2006.01)
*G06F 3/041* (2006.01)
*H01L 27/144* (2006.01)

(52) U.S. Cl.
CPC ............ *G06F 3/042* (2013.01); *G06F 3/0412* (2013.01); *H01L 27/1443* (2013.01)

(58) Field of Classification Search
CPC ..... G06F 3/042; G06F 3/0412; H01L 27/1443
See application file for complete search history.

(56) References Cited

U.S. PATENT DOCUMENTS

| | | | |
|---|---|---|---|
| 9,142,704 B2 * | 9/2015 | Jung | G06F 3/0412 |
| 2010/0265277 A1 * | 10/2010 | Takahara | G09G 3/2014 |
| | | | 345/690 |
| 2013/0088460 A1 * | 4/2013 | Ahn | G06F 3/0412 |
| | | | 345/175 |

FOREIGN PATENT DOCUMENTS

| | | |
|---|---|---|
| KR | 1020120004786 A | 1/2012 |
| KR | 1020120135406 A | 12/2012 |
| KR | 1020130037072 A | 4/2013 |

* cited by examiner

*Primary Examiner* — Lisa S Landis (74) *Attorney, Agent, or Firm* — Cantor Colburn LLP (57) ABSTRACT

A photo sensor pixel includes a pixel circuit including a driving transistor, a switching transistor having a double gate structure and a photo sensing transistor connected in series with the switching transistor. The pixel circuit drives a light emitting element therein based on a data voltage provided thereto through a data line, the switching transistor includes a top gate electrode and a bottom gate electrode, which are connected to different gate lines, respectively, and the photo sensing transistor senses incident light.

20 Claims, 8 Drawing Sheets

PHOTO SENSOR CIRCUIT, PHOTO SENSOR PIXEL, AND DISPLAY DEVICE HAVING THE PHOTO SENSOR PIXEL

This application claims priority to Korean Patent Application No. 10-2017-0007295, filed on Jan. 16, 2017, and all the benefits accruing therefrom under 35 U.S.C. § 119, the content of which in its entirety is herein incorporated by reference.

BACKGROUND

1. Field

Exemplary embodiments of the invention relate to an electronic device. More particularly, exemplary embodiments of the invention relate to a photo sensor circuit, a photo sensor pixel, and a display device including the same.

2. Discussion of Related Art

A display device includes a display panel for performing image display and a touch panel for recognizing a touch when a user's finger or a pen touches a specific position of a screen. The touch recognition method of the touch panel includes various types such as a pressure resistive type, an electrostatic capacity by contact type, a surface acoustic wave ("SAW") type, an infrared light sensing type, and a piezoelectric type, or the like.

In-cell type display panels integrating a touch sensor circuit with a display pixel has been recently developed and studied, and a touch screen panel based on photo sensing has been studied.

SUMMARY

In an in-cell type display panel, the addition of a touch sensor circuit and a photo sensor circuit increases the degree of circuit integration in the display panel, which results in a high panel defect rate. Also, the increase of the degree of circuit integration causes the aperture ratio and resolution of the display panel to decrease.

Exemplary embodiments provide a photo sensor pixel including a photo sensing transistor and a switching transistor having a double gate structure.

Exemplary embodiments provide a display device including the photo sensor pixel.

Exemplary embodiments provide a photo sensor included in the photo sensor pixel.

According to an exemplary embodiment, a photo sensor pixel includes: a pixel circuit including a driving transistor, where the pixel circuit drives a light emitting element therein based on a data voltage provided thereto through a data line; a switching transistor having a double gate structure, where the switching transistor includes a top gate electrode and a bottom gate electrode, which are connected to different gate lines, respectively; and a photo sensing transistor connected in series with the switching transistor, where the photo sensing transistor senses incident light.

In an exemplary embodiment, the top gate electrode of the switching transistor may be connected to a first gate line and the bottom gate electrode of the switching transistor may be connected to a second gate line.

In an exemplary embodiment, the switching transistor may further include a first electrode connected to the data line and a second electrode connected to the photo sensing transistor.

In an exemplary embodiment, the switching transistor may turn on in a period in which a gate signal applied to the first gate line is activated and in a period in which a gate signal applied to the second gate line is activated.

In an exemplary embodiment, the photo sensing transistor may include a first electrode connected to the second electrode of the switching transistor, a second electrode connected to a photo sensing line through which a sensing current generated by the photo sensing transistor is output, and a gate electrode connected to a third gate line.

In an exemplary embodiment, the first to third gate lines may transmit gate signals having activation levels in different periods, respectively.

In an exemplary embodiment, a channel length of an active layer of the photo sensing transistor may be longer than a channel length of an active layer of the switching transistor.

In an exemplary embodiment, the switching transistor may include a substrate, the bottom gate electrode on the substrate, a buffer layer on the substrate and the bottom gate electrode to cover the bottom gate electrode, an active layer on the buffer layer to overlap the bottom gate electrode, a first gate insulation layer on the buffer layer and the active layer, the top gate electrode on the first gate insulation layer to overlap the active layer, a second gate insulation layer on the first gate insulation layer and the top gate electrode to cover the top gate electrode, an insulating interlayer on the second gate insulation layer, a first electrode on the insulating interlayer and connected to the active layer via a first contact hole defined through the first gate insulation layer, the second gate insulation layer and the insulating interlayer, and a second electrode on the insulating interlayer to be connected to the active layer via a second contact hole defined through the first gate insulation layer, the second gate insulation layer and the insulating interlayer.

In an exemplary embodiment, the photo sensing transistor may include the gate electrode at the same layer as the bottom gate electrode of the switching transistor, an active layer at the same layer as the active layer of the switching transistor to overlap the gate electrode of the photo sensing transistor, a first electrode on the insulating interlayer and connected to the active layer of the photo sensing transistor via a third contact hole defined through the first gate insulation layer, the second gate insulation layer and the insulating interlayer, and a second electrode on the insulating interlayer to be connected to the active layer of the photo sensing transistor via a fourth contact hole defined through the first gate insulation layer, the second gate insulation layer and the insulating interlayer.

In an exemplary embodiment, a channel length of an active layer of the photo sensing transistor may be longer than a channel length of an active layer of the switching transistor.

In an exemplary embodiment, each of the switching transistor and the photo sensing transistor may be one of an oxide thin film transistor, a low temperature poly-silicon ("LTPS") thin film transistor, and a low temperature polycrystalline oxide ("LTPO") thin film transistor.

According to an exemplary embodiment, a photo sensor circuit connected to a pixel circuit includes a first switching transistor having a double gate structure, where the first switching transistor includes a top gate electrode connected to a first gate line and a bottom gate electrode connected to a second gate line, and a photo sensing transistor connected in series with the switching transistor, where the photo sensing transistor senses incident light.

In an exemplary embodiment, the photo sensor circuit may further include a second switching transistor having the double gate structure, where the second switching transistor includes a top gate electrode connected to a third gate line and a bottom gate electrode connected to a fourth gate line, where the second switching transistor is connected in parallel with the first switching transistor.

In an exemplary embodiment, each of the first and second switching transistors may further include a first electrode connected to a data line and a second electrode connected to a first node.

In an exemplary embodiment, the photo sensing transistor may include a first electrode connected to the first node, a second electrode connected to a photo sensing line through which a sensing current generated by the photo sensing transistor is output, and a gate electrode connected to a fifth gate line.

In an exemplary embodiment, the first to fifth gate lines may transmit gate signals having activation levels in different periods, respectively.

In an exemplary embodiment, a channel length of an active layer of the photo sensing transistor may be greater than channel lengths of active layers of the first and second switching transistor.

In an exemplary embodiment, each of the first switching transistor and the photo sensing transistor may be one of an oxide thin film transistor, an LTPS thin film transistor, and an LTPO thin film transistor.

According to an exemplary embodiment, a display device includes a photo sensing display panel including a plurality of photo sensor pixel rows in which a plurality of photo sensor pixels is arranged, a gate driver which provides a gate signal to the display panel, a data driver to provide a data voltage to the display panel, and a timing controller which controls the gate driver and the data driver. In such an embodiment, each of the photo sensor pixels includes a pixel circuit including a driving transistor, where the pixel circuit drives a light emitting element therein based on the data voltage, a switching transistor having a double gate structure, where the switching transistor include a top gate electrode and a bottom gate electrode, which are connected to different gate lines, respectively, and a photo sensing transistor connected in series with the switching transistor, where the photo sensing transistor senses incident light.

In an exemplary embodiment, the photo sensing display panel may further include a plurality of normal pixel rows in which a plurality of normal pixels is arranged, each of the normal pixels having the pixel circuit. In such an embodiment, the photo sensor pixel rows may be arranged between the normal pixel rows at predetermined spacing.

In such an embodiment, the photo sensor pixel may have a simple structure only including the switching transistor and the photo sensing transistor, so that the area of the photo sensor circuit may be reduced. In such an embodiment, since the switching transistor may be turned on by the plurality of gate signals, a high sensitivity of photo sensing may be ensured and the proportion of the photo sensor pixels occupied by the photo sensing display panel may be reduced.

In such an embodiment, the display device may include the photo sensing display panel having the in-cell type photo sensor pixels, so that the proportion of the photo sensor pixels occupied by the photo sensing display panel may be reduced. Thus, the photo sensing display panel such as the touch recognition, the fingerprint recognition, and the vein recognition can be realized while maintaining the sufficient aperture ratio and resolution without increasing a degree of circuit integration inside the photo sensing display panel.

In such an embodiment, the photo sensor pixel and the photo sensing display panel of the in-cell type may be realized without additional process and extra manufacturing cost for forming photo sensor circuits.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Exemplary embodiments will hereinafter be described more fully with reference to the accompanying drawings, in which various embodiments are shown.

Figure 1:
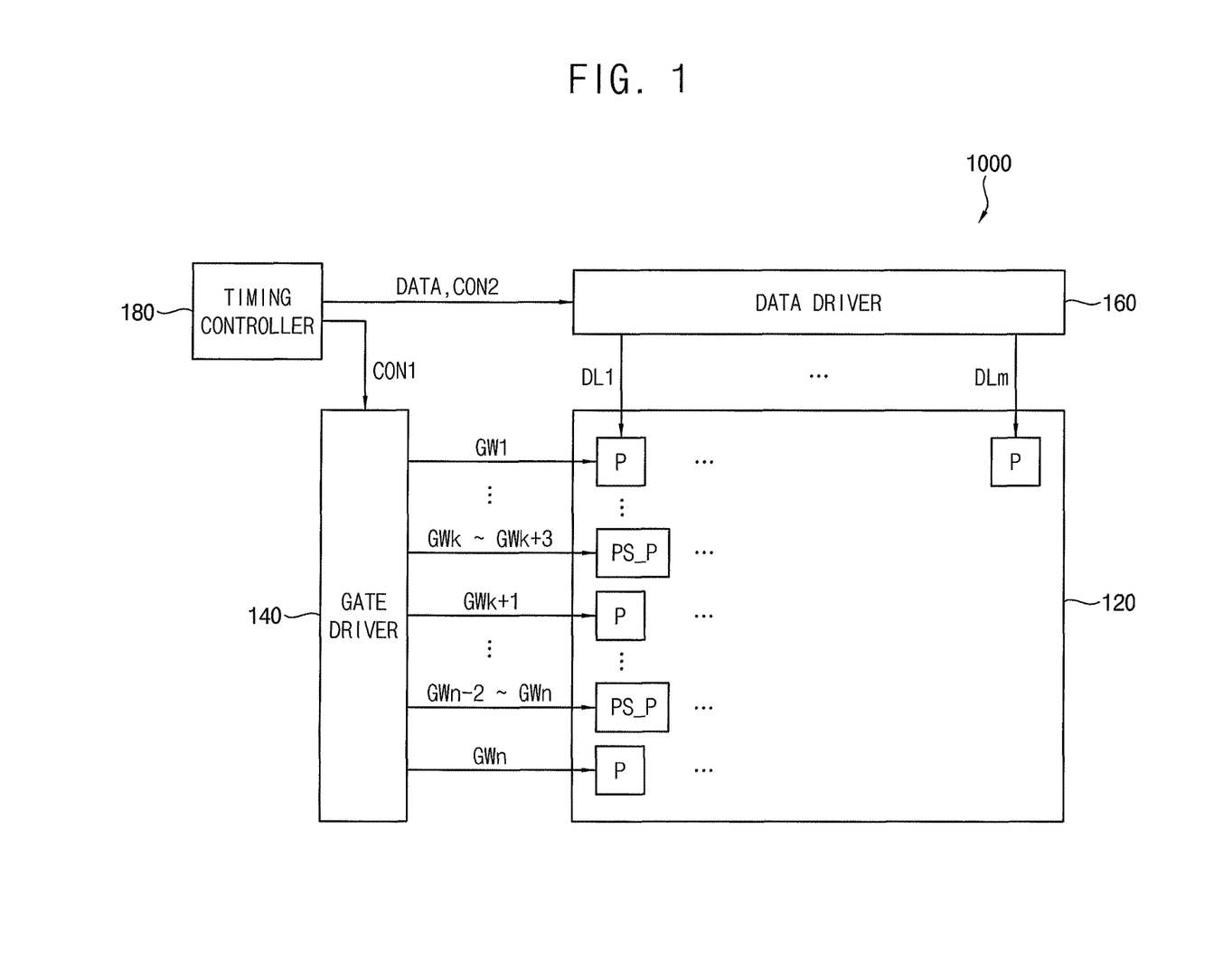
FIG. 1 is a block diagram of a display device according to an exemplary embodiment.

FIG. 1 is a block diagram of a display device according to an exemplary embodiment.

Referring to FIG. 1, an embodiment of the display device 1000 may include a photo sensing display panel 120, a gate driver 140, a data driver 160, and a timing controller 180.

In some embodiments, the photo sensing display panel 120 may be an organic light emitting display panel, a liquid crystal display panel, or the like.

The photo sensing display panel 120 may include a plurality of pixels P to display an image. In some embodiments, at least some of the pixels P may be defined as photo sensor pixels PS_P that further include a photo sensor circuit for photo sensing. In such an embodiment, the pixels may be classified into normal pixels P including only a pixel circuit and photo sensor pixels PS_P. In one embodiment, for example, the photo sensor pixels PS_P may be arranged in predetermined pixel rows with predetermined spacing. Herein, a pixel row in which the photo sensor pixels PS_P are arranged is also referred to as a photo sensor pixel row, and a pixel row in which normal pixels P are arranged is also referred to as a normal pixel row. In an embodiment, the spacing may be periodic or aperiodic. In one embodiment, for example, the photo sensor pixels PS_P may be arranged with two or four pixel row spacing (e.g., every two or four pixel rows). In some embodiments, the photo sensor pixels PS_P in an upper portion of the photo sensing display panel 120 may be denser than the photo sensor pixels PS_P in a lower portion of the photo sensing display panel 120. In such an embodiment, the pixel row spacing in the upper portion of the photo sensing display panel 120 may be narrower than the pixel row spacing in the lower portion of the photo sensing display panel 120. In an alternative embodiment, the pixel row spacing in the upper portion of the photo sensing display panel 120 may be wider than the pixel row spacing at the lower portion of the photo sensing display panel 120. The photo sensing sensitivity may be controlled depending on a density of the photo sensor pixels 100.

In such an embodiment, the photo sensing display panel 120 may be realized by an in-cell display panel in which a pixel for image display and a photo sensor circuit are integrated with each other into a single panel. In some embodiments, the photo sensor pixel PS_P may sense light and may perform the same function as a conventional touch screen. In one embodiment, for example, the photo sensor pixel PS_P may be utilized for touch recognition, fingerprint recognition, vein recognition (or touchless finger vein recognition), and the like.

Each of the photo sensor pixels PS_P may include a pixel circuit and a photo sensor circuit. The pixel circuit may be included in the normal pixel P. The normal pixel P may include the pixel circuit of various configurations. The pixel circuit may include a driving transistor for causing the light emitting element to emit light based on a data voltage received from the data driver 160. In one embodiment, for example, the pixel circuit may be implemented with a two-transistor-one-capacitor ("2T1C") structure, a three-transistor-two-capacitor ("3T2C") structure, a three-transistor-one-capacitor ("3T1C") structure, or the like.

In an embodiment, the photo sensor circuit in the photo sensor pixel PS_P may include a switching transistor of a double gate structure including a top gate electrode and a bottom gate electrode, which are connected to different gate lines, respectively, and a photo sensing transistor connected in series with the switching transistor to sense incident light. In one embodiment, for example, a K-th gate signal GWk may be applied to the pixel circuit of the photo sensor pixel PS_P, a (K+1)-th gate signal GWk+1 and a (K+2)-th gate signal GWk+2 may be applied to the switching transistor of the photo sensor circuit, and a (K+3)-th gate signal GWk+3 may be applied to the photo sensing transistor, where K is a positive integer. In such an embodiment, 4 gate signals may be provided to the photo sensor pixel PS_P. In a K-th pixel row, a K-th gate line may be connected to each pixel circuit of the photo sensor pixels PS_P a (K+1)-th gate line and a (K+2)-th gate line may be connected to the switching transistor, and a (K+3)-th gate line may be connected to the photo sensing transistor. The switching transistor may be turned on when the (K+1)-th gate signal GWk+1 or the (K+2)-th gate signal GWk+2 is activated. The photo sensing transistor may generate a photo current (drain current) by the incident light when a gate voltage of the photo sensing transistor is lower than a threshold voltage of the photo sensing transistor. The (K+3)-th gate signal GWk+3 applied to a gate electrode of the photo sensing transistor may turn on and reset the photo sensing transistor for the next photo sensing.

However, this is merely exemplary, and the gate lines connected to the photo sensor pixel PS_P is not limited thereto. In one alternative embodiment, for example, one of the gate lines connected to the switching transistor and the photo sensing transistor may be the same as the gate line connected to the pixel circuit of the photo sensor pixel PS_P. In such an embodiment, 3 gate signals may be provided to the photo sensor pixel PS_P.

In some embodiments, the photo sensor pixel PS_P may provide a sensing current or a sensing voltage to an external sensing control unit or the like through a sensing line based on the incident light by a touch or the like. The external sensing control unit may perform predetermined processing based on the sensing current or the sensing voltage.

The gate driver 140 may sequentially provide the gate signal to the normal pixels P and the photo sensor pixels PS_P through the gate lines based on a first control signal CON1 received from the timing controller 180.

The data driver 160 may provide a data voltage to the photo sensing display panel 120 through the data lines DL1 to DLm based on a second control signal CON2 and image data DATA received from the timing controller 180.

The timing controller 180 may generate the first control signal CON1 and the second control signal CON2. The timing controller 180 may provide the first control signal CON1 and the second control signal CON3 to the gate driver 140 and the data driver 160, respectively, to control the gate driver 140 and the data driver 160. In some embodiments, the timing controller 180 may include the sensing control unit.

In an embodiment, as described above, the display device 100 may include the photo sensing display panel having the photo sensor pixels PS_P of in-cell type. In such an embodiment, since the switching transistor may be turned on by the plurality of gate signals, the pixels is not desired to be all the photo sensor pixels PS_P. Thus, areas occupied by the photo sensor circuits and the photo sensor pixels PS_P in the display panel may be reduced. Therefore, the photo sensing display panel such as the touch recognition, the fingerprint recognition, and the vein recognition may be realized while maintaining the sufficient aperture ratio and resolution without increasing a degree of circuit integration inside the photo sensing display panel 120. In such an embodiment, the photo sensor pixel PS_P and the photo sensing display panel 120 of the in-cell type may be realized without additional process and manufacturing cost for forming photo sensor circuits.

Figure 2:
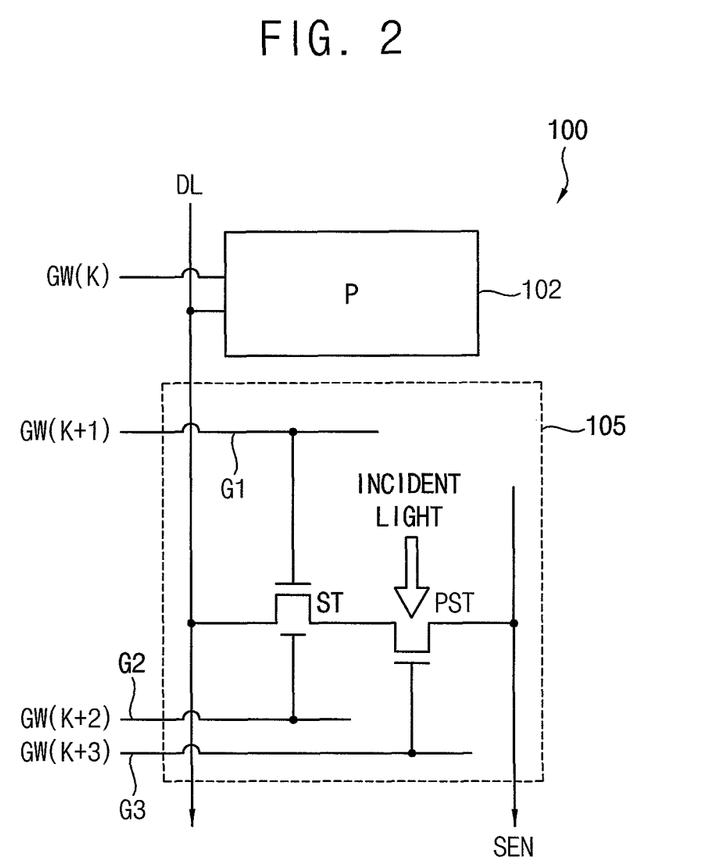
FIG. 2 is a circuit diagram of a photo sensor pixel according to an exemplary embodiment.
Figure 3:
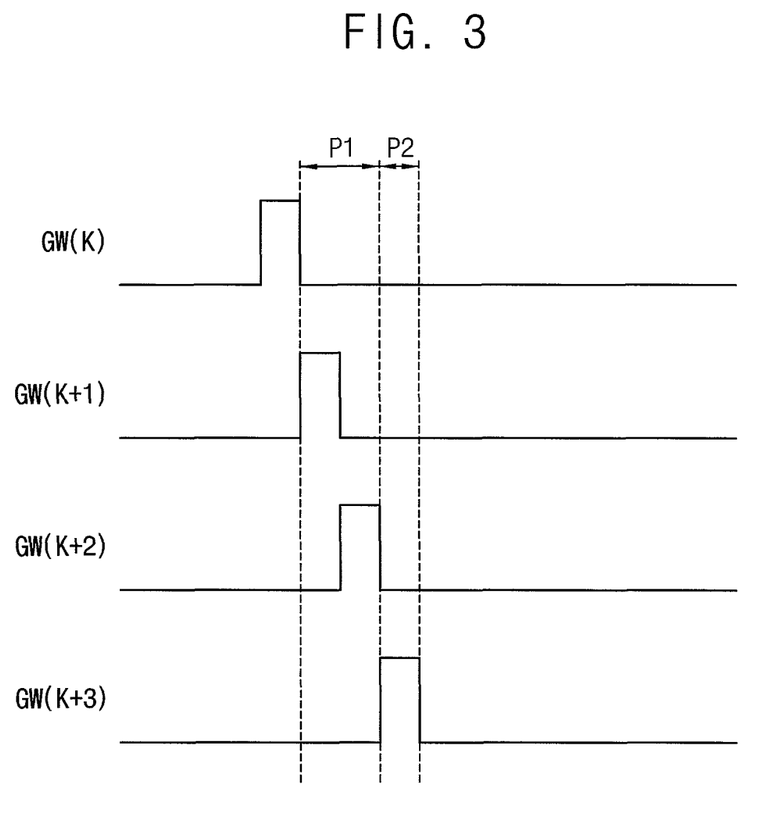
FIG. 3 is a timing diagram illustrating a photo sensing driving of the photo sensor pixel of FIG. 2.

FIG. 2 is a circuit diagram of a photo sensor pixel according to an exemplary embodiment. FIG. 3 is a timing diagram illustrating a photo sensing driving of the photo sensor pixel of FIG. 2.

Referring to FIGS. 2 and 3, an embodiment of the photo sensor pixel 100 may include a pixel circuit 102 and a photo sensor circuit 105. The photo sensor circuit 105 may include a switching transistor ST and a photo sensing transistor PST which are connected in series with each other.

The pixel circuit 102 may include a transistor turned on by a K-th gate signal GW(K) and a driving transistor that emits a light emitting element based on a data voltage applied from a data line DL. In some embodiment, the light emitting element may be an organic light emitting diode or a liquid crystal cell. In one embodiment, for example, the pixel circuit 102 may have a 2T1C pixel circuit structure.

In an embodiment, the switching transistor ST may have a double gate structure including a top gate electrode and a bottom gate electrode, which are connected to different gate lines, respectively. In one embodiment, for example, the top gate electrode may be connected to a first gate line G1 to receive a (K+1)-th gate signal GW(K+1) and the bottom gate electrode may be connected to a second gate line G2 to receive a (K+2)-th gate signal GW(K+2). However, this is merely exemplary, and the gate lines (and the gate signals) connected to the upper and bottom gate electrodes are not limited thereto.

In an embodiment, a first electrode of the switching transistor ST may be connected to the data line DL and a second electrode of the switching transistor ST may be connected to the photo sensing transistor PST. In some embodiments, the first electrode may be a source electrode and the second electrode may be a drain electrode, but not being limited thereto. Alternatively, the first electrode may be a drain electrode and the second electrode may be a source electrode.

In an embodiment, as illustrated in FIGS. 2 and 3, the switching transistor ST may be turned on when the (K+1)-th gate signal GW(K+1) is activated and/or the (K+2)-th gate signal GW(K+2) is activated. A period P1 during which the switching transistor ST is turned on may correspond to a photo sensing period P1 of the photo sensor circuit 105. In such an embodiment, as shown in FIG. 3, since the switching transistor ST is turned on twice in one frame period, the photo sensing period P1 may be substantially increased.

During the photo sensing period P1, the switching transistor ST may provide a voltage applied from the data line DL to the photo sensing transistor PST.

The photo sensing transistor PST may be connected in series with the switching transistor ST to sense incident light. The photo sensing transistor PST may be utilized as a photo sensing device because the photo sensing transistor PST has characteristics that a threshold voltage and a photocurrent (i.e., drain current) change depending on a wavelength or the amount of the incident light. In some embodiment, the photo sensing transistor PST may include a first electrode connected to the second electrode of the switching transistor ST, a photo sensing line SEN for outputting a photo sensing signal generated by the photo sensing transistor PST to the outside, and a gate electrode connected to a third gate line G3 that receives a (K+3)-th gate signal GW(K+3).

The photo sensing transistor PST may generate the sensing current (i.e., the photo current) according to the incident light during the photo sensing period P1. The sensing current may flow from the first electrode of the photo sensing transistor PST to the second electrode of the photo sensing transistor PST. The sensing current may be output to the outside through the photo sensing line SEN. An amount of the sensing current may vary depending on the intensity of light incident on the photo sensing transistor PST. In some embodiments, the intensity of the incident light may be calculated based on a voltage drop amount of the data voltage due to the operation of the photo sensing transistor PST or a magnitude of the sensing current.

In some embodiments, as illustrated in FIG. 3, the photo sensing transistor PST may be turned on by the (K+3)-th gate signal GW(K+3) and be reset (shown as a period P2 in FIG. 3) for the next photo sensing. The gate signal applied to the gate electrode of the photo sensing transistor PST is not limited thereto. In an embodiment, the gate signal applied to the gate electrode of the photo sensing transistor PST is desired to have an activation level at a time period different from activation periods of the gate signals applied to the switching transistor ST. In such an embodiment, the first to third gate lines G1, G2, and G3 may provide the gate signal having the activation level to the photo sensor circuit 105 in different periods.

In some embodiments, the photo sensor circuit 105 including the switching transistor ST and the photo sensing transistor PST may include or be formed of one of an oxide transistor process, a low temperature polycrystalline oxide ("LTPO") process, and a low temperature polysilicon ("LTPS") process. Therefore, the switching transistor ST and the photo sensing transistor PST may be one of oxide transistors, LTPO transistors, and LTPS transistors.

In an embodiment, as described above, the photo sensor pixel may have a simple photo sensing structure including the photo sensing transistor PST and the double gate switching transistor ST, thereby realizing the in-cell type photo sensor pixel 100 and the in-cell type photo sensing display panel. In such an embodiment, since the switching transistor ST is turned on by the plurality of gate signals, the pixels included in the photo sensing display panel may not have be all the photo sensor pixels 100. Thus, areas occupied by the photo sensor circuits 105 and the photo sensor pixels 100 in the photo sensing display panel may be reduced. Therefore, the photo sensing display panel such as the touch recognition, the fingerprint recognition, and the vein recognition may be realized while maintaining the sufficient aperture ratio and resolution without increasing a degree of circuit integration inside the photo sensing display panel 120. Furthermore, the photo sensor pixel 100 and the photo sensing display panel of the in-cell type may be realized without additional process and manufacturing cost for forming photo sensor circuits.

Figure 4:
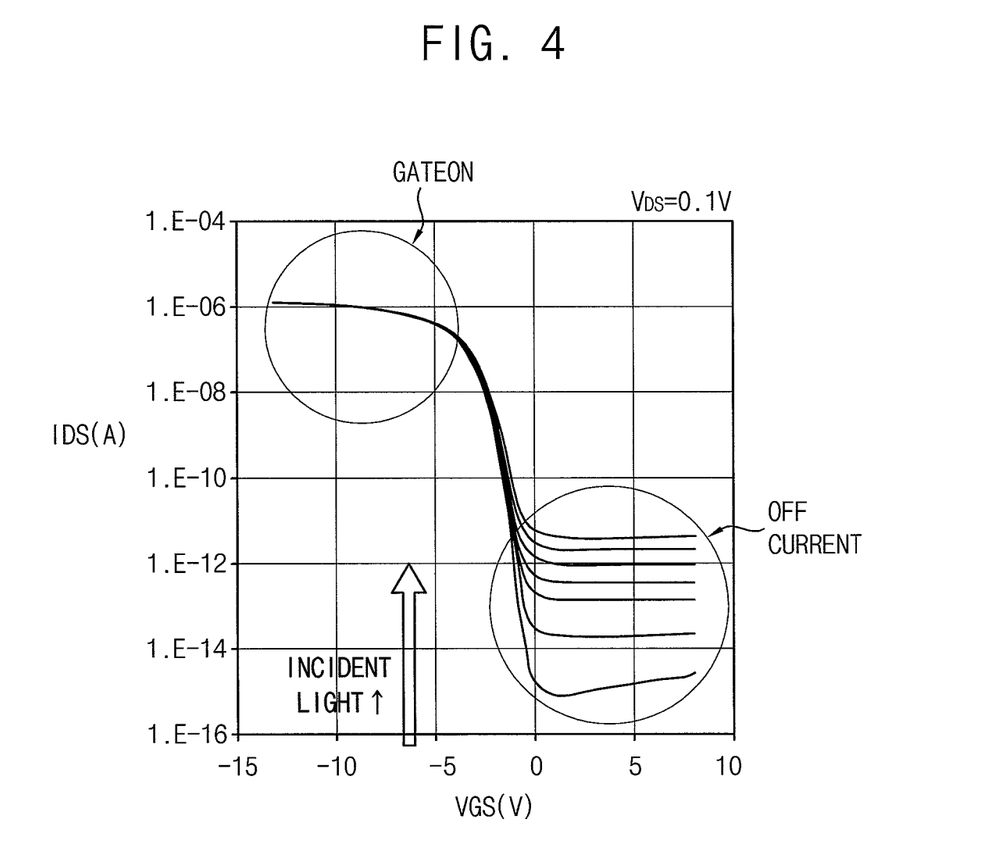
FIG. 4 is a graph illustrating an operating characteristic of an exemplary embodiment of a photo sensing transistor included in the photo sensor pixel of FIG. 2.

FIG. 4 is a graph illustrating an operating characteristic of an exemplary embodiment of a photo sensing transistor included in the photo sensor pixel of FIG. 2.

Referring to FIG. 4, in a turn-off state of the photo sensing transistor PTS, the photo current (i.e., an off-current, or a drain current) IDS may be generated by incident light. FIG. 4 shows an exemplary embodiment in which the photo sensing transistor PTS is implemented as a P-channel metal oxide semiconductor ("PMOS") transistor.

The drain current IDS may be substantially constant independently of the intensity of the incident light when the photo sensing transistor PTS is turned on by the gate signal having the activation level (indicated as GATE ON in FIG. 4). However, in a gate-off state of the photo sensing transistor PTS, a magnitude of the drain current IDS (off current, photo current) changes according to the intensity of the incident light on a channel region of the photo sensing transistor PTS.

In some embodiments, as described above, the photo sensing transistor PTS may be one of an oxide transistor, an LTPO transistor, and an LTPS transistor.

The photo sensor pixel may perform photo sensing using the photo sensing transistor PTS in the gate-off state.

In such an embodiment, a photo sensor circuit having a simple structure without a capacitor may be realized by using the series connection structure of the photo sensing transistor PTS and the switching transistor ST. Thus, the in-cell type photo sensing display panel in which the optical sensor circuit is integrated into a display pixel may be realized.

Figure 5:
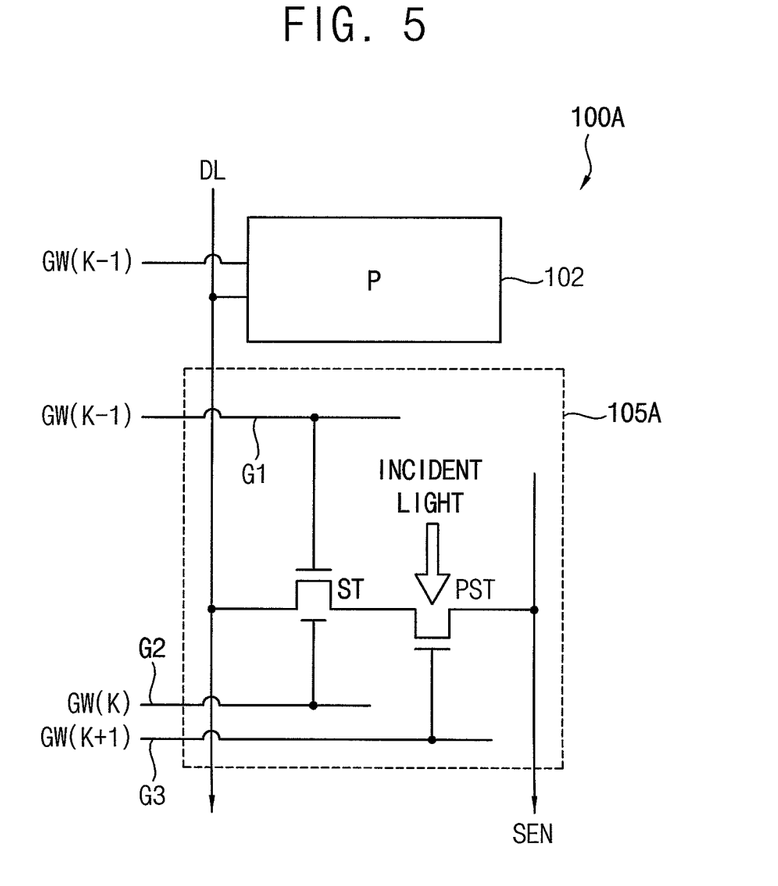
FIG. 5 is a circuit diagram illustrating an exemplary embodiment of the photo sensor pixel of FIG. 2.

FIG. 5 is a circuit diagram illustrating an exemplary embodiment of the photo sensor pixel of FIG. 2.

The photo sensor circuit of FIG. 5 is substantially the same as the photo sensor circuit explained with reference to FIG. 2 except for gate signals applied to the photo sensor circuit. Thus, the same reference numerals will be used to refer to the same or like elements in the exemplary embodiments described above with reference to FIGS. 1 to 4, and any repetitive detailed description thereof will be omitted.

Referring to FIG. 5, the photo sensor pixel 100A may include a pixel circuit 102 and a photo sensor circuit 105A. The photo sensor circuit 105A may include a switching transistor ST and a photo sensing transistor PST which are connected in series with each other.

In some embodiments, a gate signal applied to the pixel circuit 102 may be the same as one of gate signals respectively applied to a top gate electrode of the switching transistor ST, a bottom gate electrode of the switching transistor ST, and a gate electrode of the photo sensing transistor PST. In one embodiment, for example, as illustrated in FIG. 5, a gate signal GW(K−1) provided to a first gate line G1 may be the same as a gate signal GW (K−1) provided to a transistor of the pixel circuit 102.

In an embodiment, as illustrated in FIG. 5, resetting of the photo sensing transistor PST, turn-on of the top gate electrode of the switching transistor ST, and turn-on of the bottom gate electrode of the switching transistor ST may be sequentially performed in one frame period. When the switching transistor ST is turned on, the photo sensing transistor PST may perform the photo sensing operation.

Figure 6:
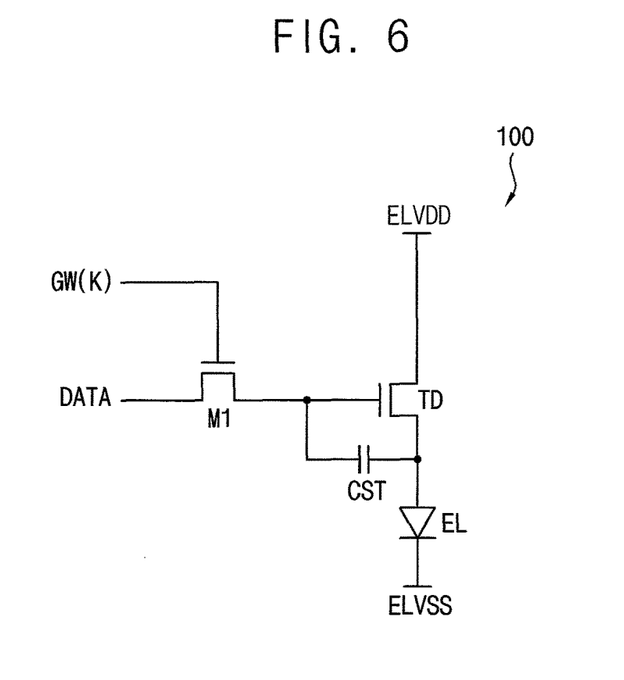
FIG. 6 is a circuit diagram illustrating an exemplary embodiment of a pixel circuit included in the photo sensor pixel of FIG. 2.

FIG. 6 is a circuit diagram illustrating an exemplary embodiment of a pixel circuit included in the photo sensor pixel of FIG. 2.

Referring to FIG. 6, an embodiment of the pixel circuit 102 may include an organic light emitting diode EL, a driving transistor TD, a scan transistor M1, and a storage capacitor CST.

An anode of the organic light emitting diode EL may be connected to the driving transistor TD and a cathode of the organic light emitting diode EL may be connected to a second power voltage ELVSS. The organic light emitting diode EL may generate light of a predetermined luminance corresponding to a driving current provided from the driving transistor TD.

The scan transistor M1 may include a gate electrode that receives a gate signal GW(K), a first electrode connected to a data line DL, and a second electrode connected to a gate electrode of the driving transistor TD.

The driving transistor TD may include the gate electrode connected to the second electrode of the scan transistor M1, a first electrode connected to a first power voltage ELVDD, and a second electrode connected to the anode of the organic light emitting diode EL.

The storage capacitor CST may be connected between the gate electrode of the driving transistor TD and the second electrode of the driving transistor TD.

The pixel circuit 102 may further include transistors for initializing the organic light emitting diode EL and the driving transistor TD, thereby compensating a threshold voltage of the driving transistor TD, and the like.

In some embodiments, the transistors in the pixel circuit 102 may be one of oxide transistors, LTPO transistors, and LTPS transistors.

Figure 7:
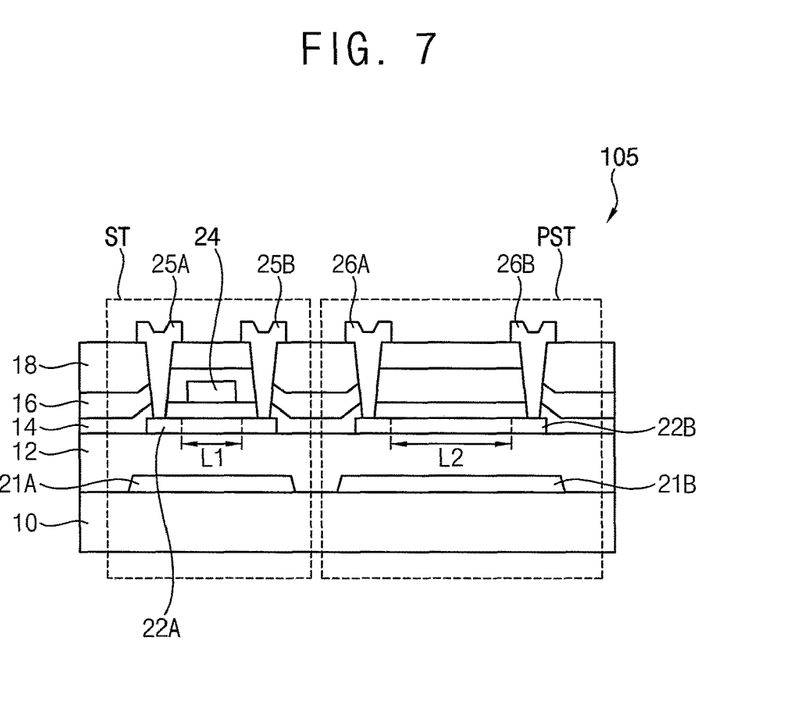
FIG. 7 is a cross-sectional view schematically illustrating a structure of an exemplary embodiment of a switching transistor and a photo sensing transistor included in the photo sensor pixel of FIG. 2.

FIG. 7 is a cross-sectional view schematically illustrating a structure of an exemplary embodiment of a switching transistor and a photo sensing transistor included in the photo sensor pixel of FIG. 2.

Referring to FIGS. 2 and 7, an embodiment of the switching transistor ST may have a double gate structure including a bottom gate electrode 21A, an active layer 22A, first and second electrodes 25A and 25B, a top gate electrode 24. The photo sensing transistor PST may include a gate electrode 21B, an active layer 22B, and first and second electrodes 26A and 26B.

The bottom gate electrode may be disposed on a substrate 10. A buffer layer 12 may be disposed on the substrate 10 the bottom gate electrode 21A to cover the substrate 10 the bottom gate electrode 21A. The substrate 10 may include a transparent substrate such as a glass substrate, a quartz substrate, a transparent resin substrate, etc. The substrate 10 may be a transparent flexible substrate.

The gate electrode 21B of the photo sensing transistor PST may be disposed on the same layer as the bottom gate electrode 21A. The bottom gate electrode 21A may include or be formed of aluminum (Al), chromium (Cr), Nickel (Ni), Molybdenum (Mo), Tungsten (W), Magnesium (Mg) and/or their alloys. The bottom gate electrode 21A may have a single-layered structure or a multi-layered structure.

The buffer layer 12 may include silicon oxide (SiOx), silicon nitride (SiNx) or silicon oxynitride (SiOxNy).

The active layer 22A of the switching transistor ST may be disposed on the buffer layer 12 to at least partially overlap the bottom gate electrode 21A. The active layer 22B of the photo sensing transistor PST may be disposed on the same layer as the active layer 22A of the switching transistor ST. The active layer 22B of the photo sensing transistor PST may at least partially overlap the gate electrode 21B of the photo sensing transistor PST. The active layers 22A and 22B may include transparent oxide semiconductor, amorphous silicon, or poly silicon.

In some embodiments, a channel length L2 of the active layer 22B of the photo sensing transistor PST may be longer than a channel length L1 of the active layer 22A of the switching transistor ST. Thus, change of the photo current (i.e., the sensing current) according to the intensity of the incident light may be easily detected, and the photo sensing function of the photo sensing transistor PST may be enhanced.

A first gate insulation layer 14 may be disposed on the buffer layer 12 and the active layers 22A and 22B. The first gate insulation layer 14 may include a silicon oxide film (SiOx), a silicon nitride film (SiNx) or a double layer thereof.

The top gate electrode 24 may be disposed on the first gate insulation layer 14 to overlap the active layer 22A of the switching transistor ST. The top gate electrode 24 may be formed of a single layer of aluminum alloy such as aluminum (Al) or aluminum-neodymium (Al—Nd) or a multi-layer of aluminum alloy on chromium (Cr) or molybdenum. In some embodiments, the top gate electrode 24 and the bottom gate electrode 21A may be connected to different gate lines, respectively.

A second gate insulation layer 16 may be disposed on the first gate insulation layer 14 and the top gate electrode 24 to cover the top gate electrode 24. The second gate insulation layer 16 may include a silicon oxide film (SiOx), a silicon nitride film (SiNx), or a double layer thereof.

An insulating interlayer 18 may be disposed on the second gate insulation layer 16. The insulating interlayer 18 may include at least one of silicon oxide (SiOx), silicon nitride (SiNx), silicon oxynitride (SiOxNy), silicon oxycarbide (SiOxCy), silicon carbonitride (SiCxNy) or a combination thereof.

A first electrode 25A and a second electrode 25B of the switching transistor ST may be disposed on the insulating interlayer 18 and connected to the active layer 22A via contact holes (e.g., a first contact hole and a second contact hole) defined through the first gate insulation layer 14, the second gate insulation layer 16 and the insulating interlayer 18. In some embodiments, the first electrode 25A and the second electrode 25B may be a source electrode and a drain electrode, respectively.

A first electrode 26A and a second electrode 26B of the photo sensing transistor PST may be disposed on the insulating interlayer 18, and connected to the active layer 22B via contact holes (e.g., a third contact hole and a fourth contact hole) defined through the first gate insulation layer 14, the second gate insulation layer 16 and the insulating interlayer 18. In some embodiments, the first electrode 26A and the second electrode 26B may be a source electrode and a drain electrode, respectively.

The first electrodes 25A and 26A and the second electrodes 25B and 26B may include or be formed of one of molybdenum (Mo), tungsten (W), molybdate tungsten (MoW), aluminum (Al), aluminum-neodymium (Al—Nd), titanium (Ti), titanium nitride (TiN), copper (Cu), molybdenum alloy (Mo alloy), aluminum alloy, copper alloy and a combination thereof.

Figure 8:
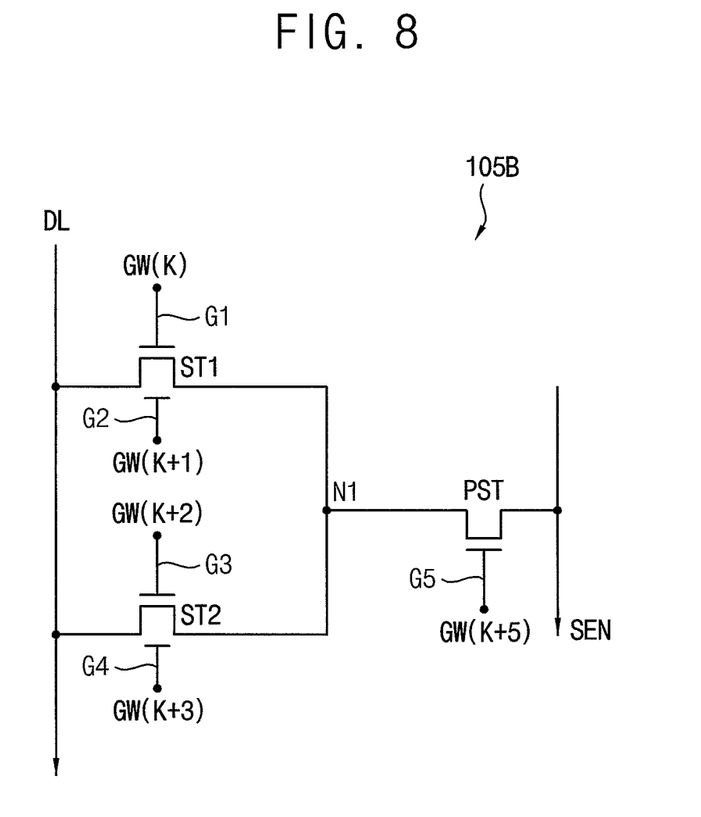
FIG. 8 is a circuit diagram illustrating an alternative exemplary embodiment of a photo sensor circuit.

FIG. 8 is a circuit diagram illustrating an alternative exemplary embodiment of a photo sensor circuit.

The photo sensor circuit of FIG. 8 is substantially the same as the photo sensor circuit explained with reference to FIG. 2 except for a structure that a plurality of switching transistors are connected in parallel. Thus, the same reference numerals will be used to refer to the same or like elements in the exemplary embodiments described above with reference to FIGS. 1 to 7, and any repetitive detailed description thereof will be omitted.

Referring to FIGS. 2 and 8, an exemplary embodiment of the photo sensor circuit 105B may include a first switching transistor ST1, a second switching transistor ST2, and a photo sensing transistor PST.

Each of the first and second switching transistors ST1 and ST2 may have the double gate structure.

The first switching transistor ST1 may include a top gate electrode connected to a first gate line G1, a bottom gate electrode connected to a second gate line G2, a first electrode connected to a data line DL, and a second electrode connected to a first node N1.

The second switching transistor ST2 may be connected in parallel with the first switching transistor ST1. The second switching transistor ST2 may include a top gate electrode connected to a third gate line G3, a bottom gate electrode connected to a fourth gate line G4, a first electrode connected to the data line DL, and a second electrode connected to the first node N1.

The first to fourth gate lines G1, G2, G3, and G4 may carry gate signals having activation levels in different periods. Accordingly, a specific voltage may be provided to a first electrode of the photo sensing transistor PST by four gate signals GW(K), GW(K+1), GW(K+2), and GW(K+3) in one frame period. In such an embodiment, photo sensor pixels including the photo sensor circuit 105B may be arranged at four pixel row spacing in the photo sensing display panel.

The photo sensing transistor PST may include a first electrode connected to the first node N1, a second electrode connected to a photo sensing line SEN outputting a sensing current generated by the photo sensing transistor PST, and a gate electrode connected to fifth gate line G5. The photo sensing transistor PST may detect an intensity of the incident light and output corresponding sensing current when the first switching transistor ST1 or the second switching transistor is turned on. The photo sensing transistor PST may be turned on by a gate signal GW(K+5) applied to the fifth gate line G5 so that a state of the photo sensing transistor PST may be reset. In some embodiments, the first to fifth gate lines G1 to G5 may provide the gate signal having the activation level in different periods.

In some embodiments, as described above, the channel length of the active layer of the photo sensing transistor PST may be longer than the channel lengths of the active layer of the first and second switching transistors ST1 and ST2.

In such an embodiment, as described above, the photo sensor circuit 105B may have a structure of which the double gate first and second switching transistors ST1 and ST2 are connected in parallel, so that the photo sensing may be performed by the plurality of gate signals. Thus, the area occupied by the photo sensor circuit in the photo sensing display panel may be reduced and aperture ratio and resolution of the photo sensing display panel may be increased.

Figure 9:
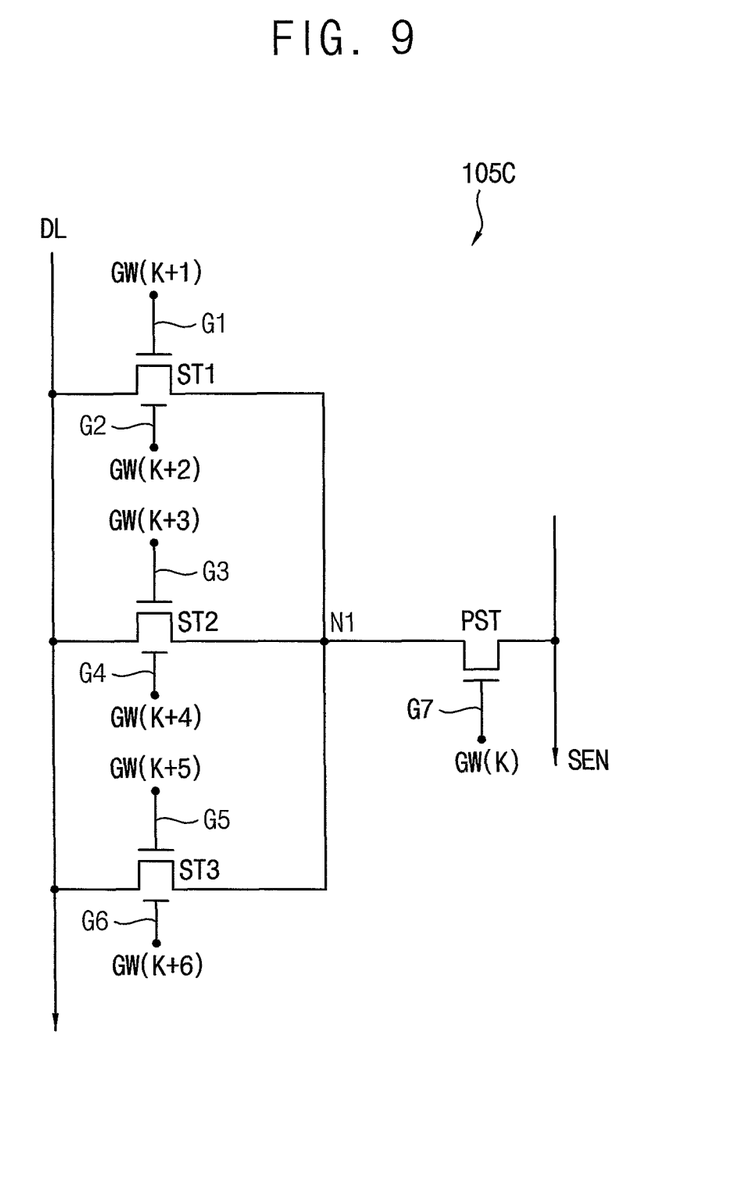
FIG. 9 is a circuit diagram illustrating an alternative exemplary embodiment of a photo sensor circuit.

FIG. 9 is a circuit diagram illustrating an alternative exemplary embodiment of a photo sensor circuit.

The photo sensor circuit of FIG. 9 is substantially the same as the photo sensor circuit explained with reference to FIGS. 2 and 8 except for a structure that a plurality of switching transistors are connected in parallel. Thus, the same reference numerals will be used to refer to the same or like elements in the exemplary embodiments described above with reference to FIGS. 1 to 8, and any repetitive detailed description thereof will be omitted.

Referring to FIGS. 2 and 9, an embodiment, the photo sensor circuit 105C may include a first switching transistor ST1, a second switching transistor ST2, a third switching transistor ST3, and a photo sensing transistor PST.

The first to third switching transistors ST1, ST2, and ST3 may be connected between a data line DL and a first node N1 in parallel.

First to sixth gate lines G1 to G6 may carry gate signals having activation levels in different periods. Accordingly, a specific voltage may be provided to a first electrode of the photo sensing transistor PST by six gate signals GW(K+1), GW(K+2), GW(K+3), GW(K+4), GW(K+5), and GW(K+6) in one frame period. In such an embodiment, photo sensor pixels including the photo sensor circuit 105C may be arranged at six pixel row spacing in the photo sensing display panel.

The photo sensing transistor PST may detect an intensity of the incident light and output corresponding sensing current when one of the first to third switching transistors ST1 to ST3 is turned on. The photo sensing transistor PST may be turned on by a gate signal GW(K) applied to a seventh gate line G7 so that a state of the photo sensing transistor PST may be reset. In some embodiments, the first to seventh gate lines G1 to G7 may provide the gate signal having the activation level in different periods.

In some embodiments, the channel length of the active layer of the photo sensing transistor PST may be longer than the channel lengths of the active layer of the first to third switching transistors ST1 to ST3.

In embodiments of the invention, as described above, the photo sensor circuit 105C may have a structure in which the plurality of double gate switching transistors ST1 to ST3 are connected in parallel, so that the photo sensing may be performed by the plurality of gate signals. Thus, the area occupied by the photo sensor circuit in the photo sensing display panel may be reduced and aperture ratio and resolution of the photo sensing display panel may be increased.

The embodiments of the invention described herein may be applied to any display device having photo sensing function and any system including the display device. In one embodiment, for example, the embodiments may be applied to a television, a computer monitor, a laptop, a digital camera, a cellular phone, a smart phone, a smart pad, a personal digital assistant ("PDA"), a portable multimedia player ("PMP"), a MP3 player, a navigation system, a game console, a video phone, etc.

The foregoing is illustrative of an exemplary embodiment, and is not to be construed as limiting thereof. Although a few an exemplary embodiment have been described, those skilled in the art will readily appreciate that many modifications are possible in exemplary embodiments without materially departing from the novel teachings and advantages of an exemplary embodiment. Accordingly, all such modifications are intended to be included within the scope of an exemplary embodiment as defined in the claims. In the claims, means-plus-function clauses are intended to cover the structures described herein as performing the recited function and not only structural equivalents but also equivalent structures. Therefore, it is to be understood that the foregoing is illustrative of an exemplary embodiment and is not to be construed as limited to the specific embodiments disclosed, and that modifications to the disclosed an exemplary embodiment, as well as other an exemplary embodiment, are intended to be included within the scope of the appended claims. The invention is defined by the following claims, with equivalents of the claims to be included therein.

What is claimed is:

1. A photo sensor pixel, comprising:
   a pixel circuit including a driving transistor, wherein the pixel circuit drives a light emitting element therein based on a data voltage provided thereto through a data line;
   a switching transistor having a double gate structure, wherein the switching transistor comprises a top gate electrode and a bottom gate electrode, which are connected to different gate lines, respectively; and
   a photo sensing transistor connected in series with the switching transistor, wherein the photo sensing transistor senses incident light.

2. The photo sensor pixel of claim 1, wherein
   the top gate electrode of the switching transistor is connected to a first gate line, and
   the bottom gate electrode of the switching transistor is connected to a second gate line.

3. The photo sensor pixel of claim 2, wherein the switching transistor further comprises:
   a first electrode connected to the data line; and
   a second electrode connected to the photo sensing transistor.

4. The photo sensor pixel of claim 3, wherein the switching transistor turns on in a period in which a gate signal applied to the first gate line is activated and in a period in which a gate signal applied to the second gate line is activated.

5. The photo sensor pixel of claim 3, wherein the photo sensing transistor comprises:
   a first electrode connected to the second electrode of the switching transistor;

a second electrode connected to a photo sensing line through which a sensing current generated by the photo sensing transistor is output; and a gate electrode connected to a third gate line.

6. The photo sensor pixel of claim 5, wherein the first to third gate lines transmit gate signals having activation levels in different periods, respectively.

7. The photo sensor pixel of claim 1, wherein a channel length of an active layer of the photo sensing transistor is longer than a channel length of an active layer of the switching transistor.

8. The photo sensor pixel of claim 1, wherein the switching transistor comprises:
   a substrate;
   the bottom gate electrode on the substrate;
   a buffer layer on the substrate and the bottom gate electrode to cover the bottom gate electrode;
   an active layer on the buffer layer to overlap the bottom gate electrode;
   a first gate insulation layer on the buffer layer and the active layer;
   the top gate electrode on the first gate insulation layer to overlap the active layer;
   a second gate insulation layer on the first gate insulation layer and the top gate electrode to cover the top gate electrode;
   an insulating interlayer on the second gate insulation layer;
   a first electrode on the insulating interlayer and connected to the active layer via a first contact hole defined through the first gate insulation layer, the second gate insulation layer and the insulating interlayer; and
   a second electrode on the insulating interlayer and connected to the active layer via a second contact hole defined through the first gate insulation layer, the second gate insulation layer and the insulating interlayer.

9. The photo sensor pixel of claim 8, wherein the photo sensing transistor comprises:
   the gate electrode at the same layer as the bottom gate electrode of the switching transistor;
   an active layer at the same layer as the active layer of the switching transistor to overlap the gate electrode of the photo sensing transistor;
   a first electrode on the insulating interlayer and connected to the active layer of the photo sensing transistor via a third contact hole defined through the first gate insulation layer, the second gate insulation layer and the insulating interlayer; and
   a second electrode on the insulating interlayer and connected to the active layer of the photo sensing transistor via a fourth contact hole defined through the first gate insulation layer, the second gate insulation layer and the insulating interlayer.

10. The photo sensor pixel of claim 9, wherein a channel length of an active layer of the photo sensing transistor is longer than a channel length of an active layer of the switching transistor.

11. The photo sensor pixel of claim 1, wherein each of the switching transistor and the photo sensing transistor is one of an oxide thin film transistor, a low temperature polysilicon thin film transistor and a low temperature polycrystalline oxide thin film transistor.

12. A photo sensor circuit connected to a pixel circuit, the photo sensor circuit comprising:
    a first switching transistor having a double gate structure, wherein the first switching transistor comprises a top gate electrode connected to a first gate line and a bottom gate electrode connected to a second gate line; and
    a photo sensing transistor connected in series with the switching transistor, wherein the photo sensing transistor senses incident light.

13. The photo sensor circuit of claim 12, further comprises:
    a second switching transistor having the double gate structure, wherein the second switching transistor comprises a top gate electrode connected to a third gate line and a bottom gate electrode connected to a fourth gate line,
    wherein the second switching transistor is connected in parallel with the first switching transistor.

14. The photo sensor circuit of claim 13, wherein each of the first and second switching transistors further includes:
    a first electrode connected to a data line; and
    a second electrode connected to a first node.

15. The photo sensor circuit of claim 13, wherein the photo sensing transistor includes:
    a first electrode connected to the first node;
    a second electrode connected to a photo sensing line, through which a sensing current generated by the photo sensing transistor is output; and
    a gate electrode connected to a fifth gate line.

16. The photo sensor circuit of claim 15, wherein the first to fifth gate lines transmit gate signals having activation levels in different periods, respectively.

17. The photo sensor circuit of claim 12, wherein a channel length of an active layer of the photo sensing transistor is greater than channel lengths of active layers of the first and second switching transistor.

18. The photo sensor circuit of claim 12, wherein each of the first switching transistor and the photo sensing transistor is one of an oxide thin film transistor, a low temperature poly-silicon thin film transistor, and a low temperature polycrystalline oxide thin film transistor.

19. A display device comprising:
    a photo sensing display panel including a plurality of photo sensor pixel rows in which a plurality of photo sensor pixels is arranged;
    a gate driver which provides a gate signal to the display panel;
    a data driver which provides a data voltage to the display panel; and
    a timing controller which controls the gate driver and the data driver,
    wherein each of the photo sensor pixels comprises:
        a pixel circuit including a driving transistor, wherein the pixel circuit drives a light emitting element therein based on the data voltage provided thereto;
        a switching transistor having a double gate structure, wherein the switching transistor comprises a top gate electrode and a bottom gate electrode, which are connected to different gate lines, respectively; and
        a photo sensing transistor connected in series with the switching transistor to sense incident light.

20. The display device of claim 19, wherein the photo sensing display panel further comprises:
    a plurality of normal pixel rows in which a plurality of normal pixels is arranged,
    wherein each of the normal pixels comprises the pixel circuit, and wherein the photo sensor pixel rows is arranged between the normal pixel rows with predetermined spacing.

* * * * *